United States Patent [19]

Quinn

[11] Patent Number: 5,724,000
[45] Date of Patent: Mar. 3, 1998

[54] DIFFERENTIAL SWITCHED CAPACITOR FILTERING

[75] Inventor: Patrick J. Quinn, Eindhoven, Netherlands

[73] Assignee: U.S. Philips Corporation, New York, N.Y.

[21] Appl. No.: 734,275

[22] Filed: Oct. 21, 1996

[30] Foreign Application Priority Data

Oct. 20, 1995 [EP]  European Pat. Off. ............... 95202849

[51] Int. Cl.$^6$ ........................... H03K 5/00; H03H 11/12
[52] U.S. Cl. ........................ 327/554; 333/173; 330/9
[58] Field of Search ........................ 327/91, 94, 552, 327/554, 337; 333/173; 330/9, 51, 294, 107

[56] References Cited

U.S. PATENT DOCUMENTS 4,862,121  8/1989  Hochschild et al. .................. 333/173

*Primary Examiner*—Timothy P. Callahan
*Assistant Examiner*—Dinh T. Le
*Attorney, Agent, or Firm*—Edward W. Goodman

[57] ABSTRACT

A differential switched capcitor filter section which includes a differential amplifier (OTA), a first set of switched capacitors (C11, C12) coupled between a non-inverting output (+) and an inverting input (−) of the differential amplifier (OTA), and a second set of switched capacitors (C21, C22) coupled between an inverting output (−) and a non-inverting input (+) of the differential amplifier (OTA). In the sets of switched capacitors (C11, C12; C21, C22), first terminals of the capacitors are coupled to a corresponding one of the outputs (+; −) of the differential amplifier (OTA) thru first switches (S1.11, S1.12; S1.21, S1.22), and to one of the differential inputs (Vin+; Vin−) of the filter section thru second switches (S2.11, S2.12; S2.21, S2.22). Second terminals of the capacitors are coupled to a corresponding one of the inputs (−, +) of the differential amplifier (OTA) thru third switches (S3.11, S3.12; S3.21, S3.22), and to a reference terminal thru fourth switches (S4.11, S4.12; S4.21, S4.22). Within each set, corresponding switches operate at mutually differing switching phases ($\Phi 1$; $\Phi 2$).

4 Claims, 5 Drawing Sheets

5,724,000

DIFFERENTIAL SWITCHED CAPACITOR FILTERING

BACKGROUND OF THE INVENTION

1. Field of the Invention

The invention relates to a differential switched capacitor filter section, and to a television signal receiver comprising a SECAM decoder including such a filter section.

2. Description of the Related Art

The article "Switched-capacitor delay circuit that is insensitive to capacitor mismatch and stray capacitance", by K. Nagaraj, in Electronics Letters, 2nd Aug. 1984, Vol. 20, No. 16, pp. 663–664, discloses a switched capacitor delay circuit which uses a single amplifier and is insensitive to capacitor mismatch and stray capacitance. At a first clock phase, a first capacitor samples the input (which is the output from the previous stage) whereas a second capacitor is connected across the amplifier. Thus, the output of the amplifier equals the voltage across the second capacitor. At a second clock phase, the capacitors are interchanged by an appropriate operation of the surrounding switches. Thus the output voltage assumes a new value equal to the voltage which was present at the input during the previous clock cycle. At the same time, the input is sampled by the second capacitor. During the next clock cycle, the capacitors are again interchanged. This process continues and the circuit functions as a delay line having a delay equal to one clock interval. It is evident that since there is no charge transfer between the capacitors, the operation of the circuit is independent of the ratio between the capacitors. Also, since the capacitor nodes are switched either between ground and virtual ground, or between voltage sources, the circuit is insensitive to parasitic capacitances.

However, DC offsets and signal distortion occur due to channel charge injection of the switches at the moment of switch off. Non-linear capacitors and signal dependence of the on-resistance of the switches give rise to extra distortion. Other major sources of distortion in large mixed signal circuits are those due to substrate bounce from unrelated clock sources, power supply noise, clock noise, clock feedthrough and offsets.

SUMMARY OF THE INVENTION

It is, inter alia, an object of the invention to maintain the advantages of the prior art circuit while avoiding its disadvantages. To this end, a first aspect of the invention provides a differential switched capacitor filter section having at least one pair of differential inputs and at least one pair of differential outputs, the filter section comprising a differential amplifier; a first set of switched capacitors coupled between a non-inverting output and an inverting input of said differential amplifier; a second set of switched capacitors coupled between an inverting output and a non-inverting input of said differential amplifier, where said inverting and non-inverting outputs of said differential amplifier are coupled to said at least one pair of differential outputs of said filter section; and wherein in said sets of switched capacitors, first terminals of the capacitors are coupled to a corresponding one of said outputs of said differential amplifier thru first switches operating at mutually differing switching phases within each set, and to one of said differential inputs of said filter section thru second operating at mutually differing switching phases within each set, while second terminals of the capacitors are coupled to a corresponding one of said inputs of said differential amplifier thru third switches operating at mutually differing switching phases within each set, and to a reference terminal thru fourth switches operating at mutually differing switching phases within each set. A second aspect of the invention provides a television signal receiver comprising means for decoding a SECAM television signal, characterized in that said SECAM decoding means include a differential switched capacitor filter section as described above.

A primary aspect of the invention provides a differential switched capacitor filter section which comprises a differential amplifier, a first set of switched capacitors coupled between a non-inverting output and an inverting input of the differential amplifier, and a second set of switched capacitors coupled between an inverting output and a non-inverting input of the differential amplifier. In the sets of switched capacitors, first terminals of the capacitors are coupled to a corresponding one of the outputs of the differential amplifier thru first switches and to one of the differential inputs of the filter section thru second switches. Second terminals of the capacitors are coupled to a corresponding one of the inputs of the differential amplifier thin third switches, and to a reference terminal thru fourth switches. Within each set, corresponding switches operate at mutually differing switching phases.

These and other aspects of the invention will be apparent from and elucidated with reference to the embodiments described hereinafter.

DESCRIPTION OF THE PREFERRED EMBODIMENTS

Figure 1:
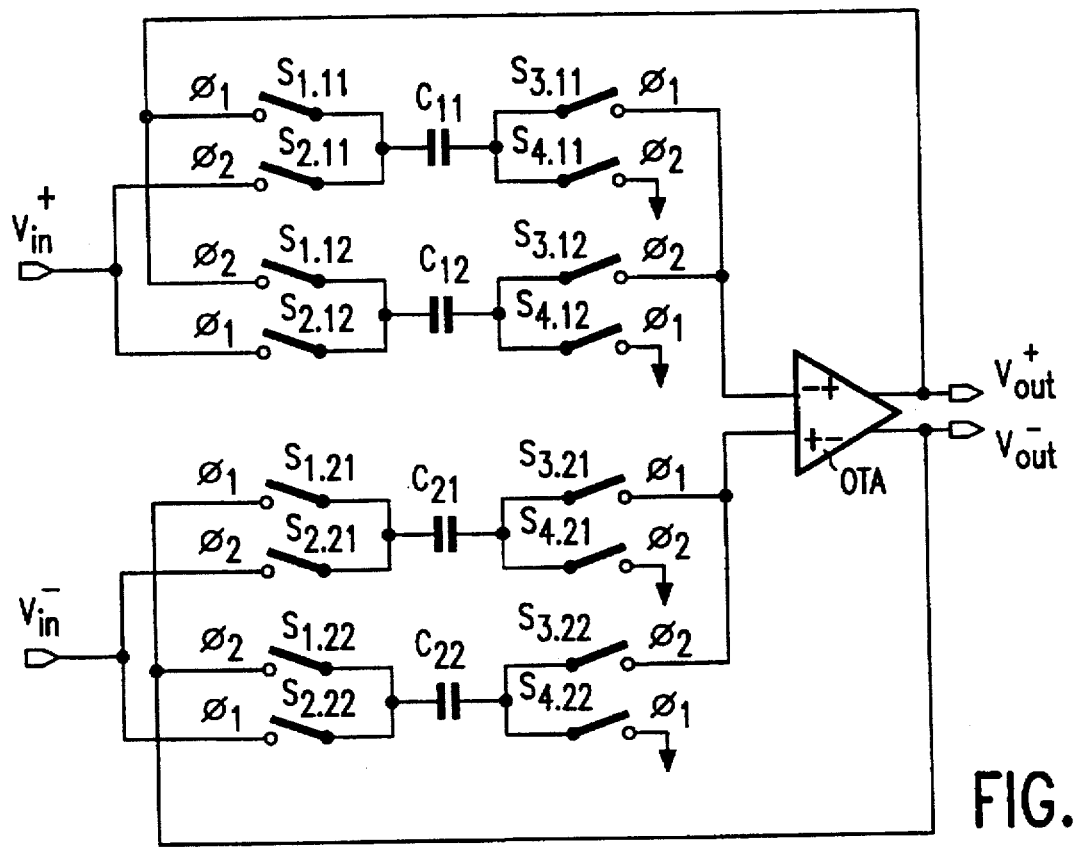
FIG. 1 shows a differential non-inverting one sampling period delay circuit in accordance with a first embodiment of the invention.

The differential non-inverting delay circuit of FIG. 1 comprises a differential amplifier OTA with inverting and non-inverting inputs, and with inverting and non-inverting outputs which are coupled to differential outputs Vout+ and Vout− of the delay circuit. The delay circuit further comprises a first set of capacitors C11, C12 coupled between the non-inverting output and the inverting input of the differential amplifier OTA, and a second set of capacitors C21, C22 coupled between the inverting output and the non-inverting input of the differential amplifier OTA. In the sets of capacitors C11, C12, and C21, C22, first terminals of the capacitors are coupled to a corresponding one of the outputs of the differential amplifier OTA thru first switches S1.11, S1.12, and S1.21, S1.22, where within each set, corresponding switches (e.g., both first switches S1.11, S1.12 in the set formed with the capacitors C11, C12) operate at mutually differing switching phases $\Phi 1$, $\Phi 2$, and ,$\Phi 1$, $\Phi 2$, respectively. The first terminals of the capacitors C11, C12, and C21, C22, are also coupled to one of the differential inputs Vin+ and Vin− of the delay circuit of FIG. 1 thru second switches S2.11, S2.12, and S2.21, S2.22, where within each set, the second switches operate at mutually differing switching phases Φ2, Φ1, and Φ2, Φ1, respectively. Second terminals of the capacitors C1, C2, and C3, C4 are coupled to a corresponding one of the inputs of the differential amplifier OTA thru third switches S3.11, S3.12, and S3.21, S3.22, where within each set, the third switches operate at mutually differing switching phases Φ1, Φ2, and Φ1, Φ2, respectively. The second terminals of the capacitors C11, C12, and C21, C22, are also coupled to ground thru fourth switches S4.11, S4.12, and S4.21, S4.22, where within each set, the fourth switches operate at mutually differing switching phases Φ2, Φ1, and Φ2, Φ1, respectively. While the four capacitors C11, C12, C21, C22 should have the same nominal value, capacitance matching is not critical.

Figure 2:
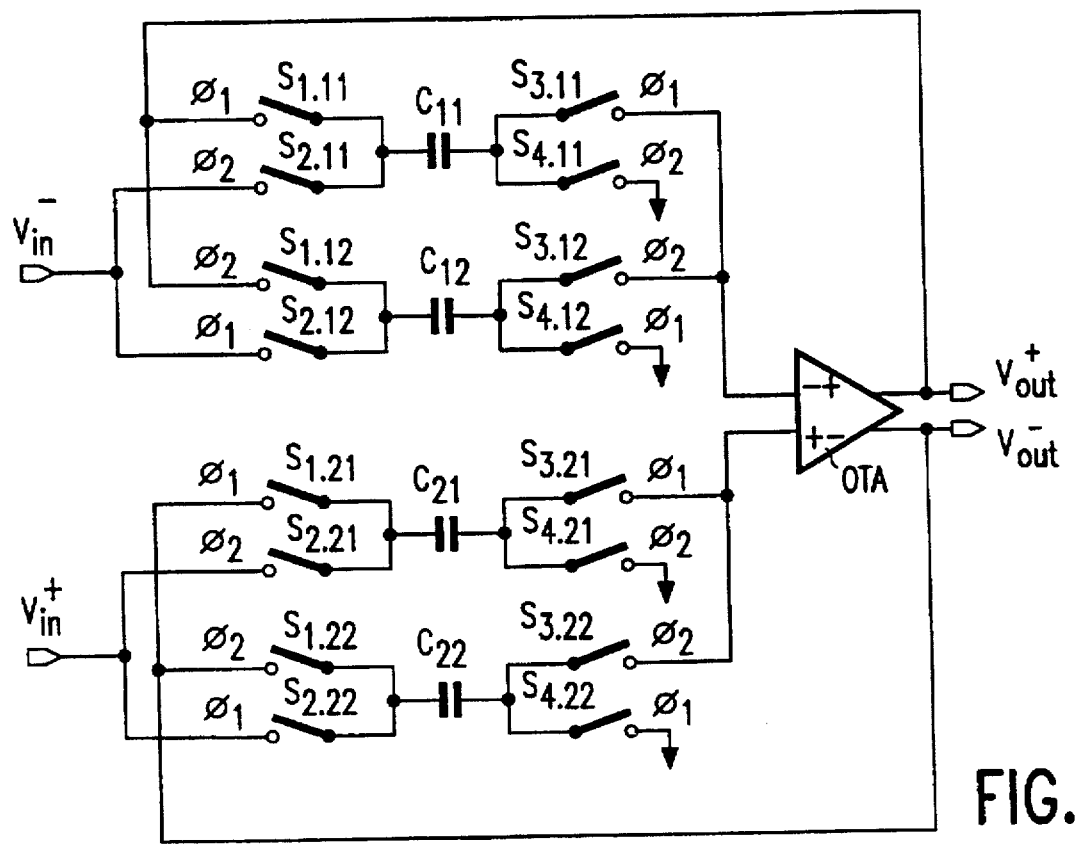
FIG. 2 shows a differential inverting one sampling period delay circuit in accordance with a second embodiment of the invention.

The differential inverting delay circuit of FIG. 2 corresponds to the differential non-inverting delay circuit of FIG. 1. The sole difference is formed by interchanging the inputs Vin+ and Vin−.

Figure 3:
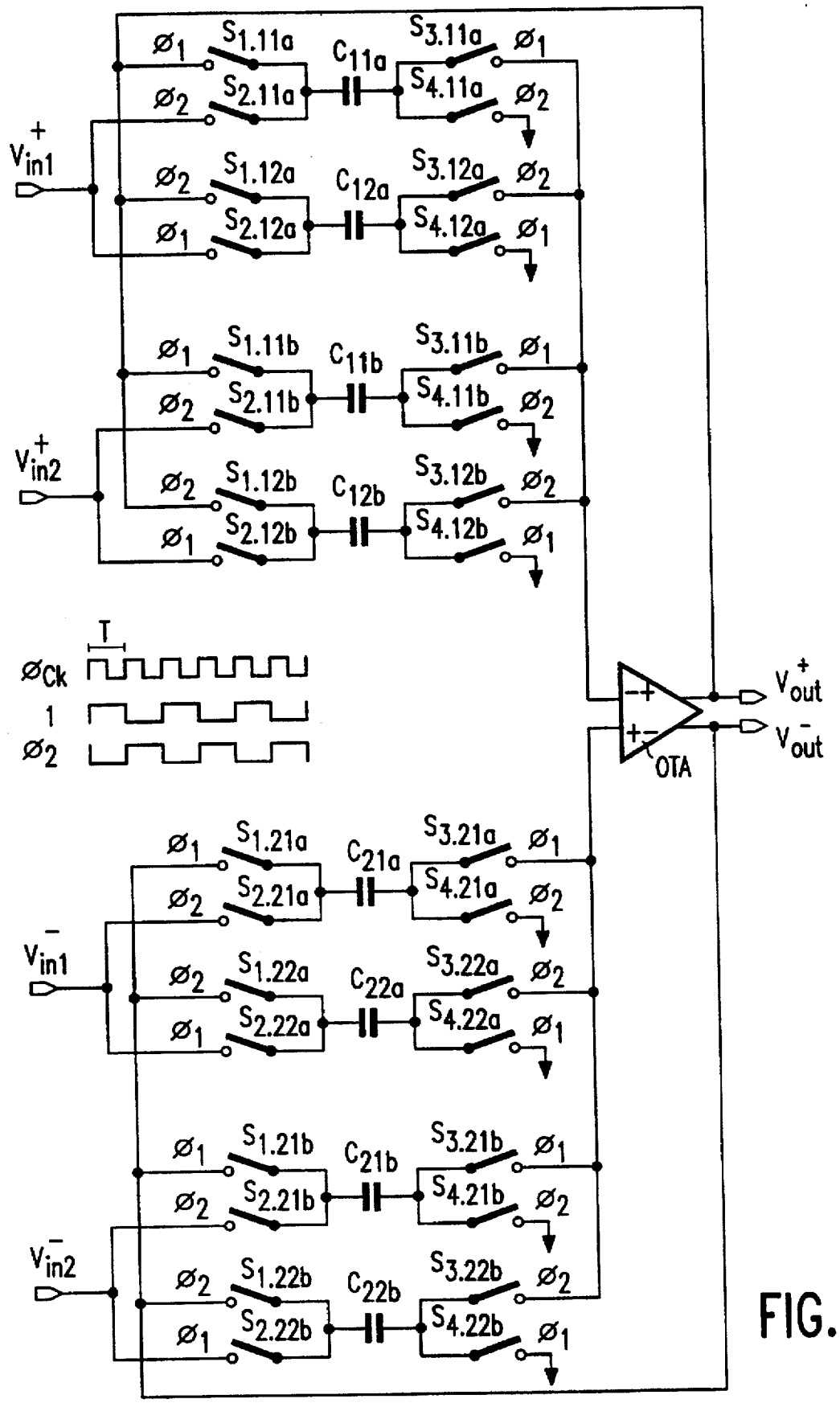
FIG. 3 shows a differential one sampling period delay and summing circuit in accordance with a third embodiment of the invention.

FIG. 3 shows a summing delay section in which two differential signals (Vin1+, Vin1−) and (Vin2+, Vin2−) are summed and delayed over a sampling period. To this end, the circuit comprises two pairs of differential inputs for receiving the two differential input signal pairs (Vin1+, Vin1−) and (Vin2+, Vin2−). The circuit resembles that of FIG. 1, but comprises, in addition to a first set of the capacitor-switches arrangements (C11; S1.11, S2.11, S3.11, S4.11), (C12; S1.12, S2.12, S3.12, S4.12), (C21; S1.21, S2.21, S3.21, S4.21), and (C22; S1.22, S2.22, S3.22, S4.22), in FIG. 3 all provided with the additional label "a" to form C11a, C12a, C21a and C22a, etc., which first set of capacitor-switches arrangements is coupled to receive and process the first differential input pair (Vin1+, Vin1−), a completely similar second set of capacitor-switches arrangements (C11b; S1.11b, S2.11b, S3.11b, S4.11b), (C12b; S1.12b, S2.12b, S3.12b, S4.12b), (C21b; S1.21b, S2.21b, S3.21b, S4.21b), and (C22b; S1.22b, S2.22b, S3.22b, S4.22b), which is coupled to receive and process the second differential input pair (Vin2+, Vin2−).

The following formula holds for the circuit of FIG. 3:

$$Vout(nT)=[C1.Vin1((n-1)T)+C2.Vin2((n-1)T)]/(C1+C2),$$

where $$C11a=C12a=C21a=C22a=C1,$$

and $$C11b=C12b=C21b=C22b=C2.$$

Figure 4:
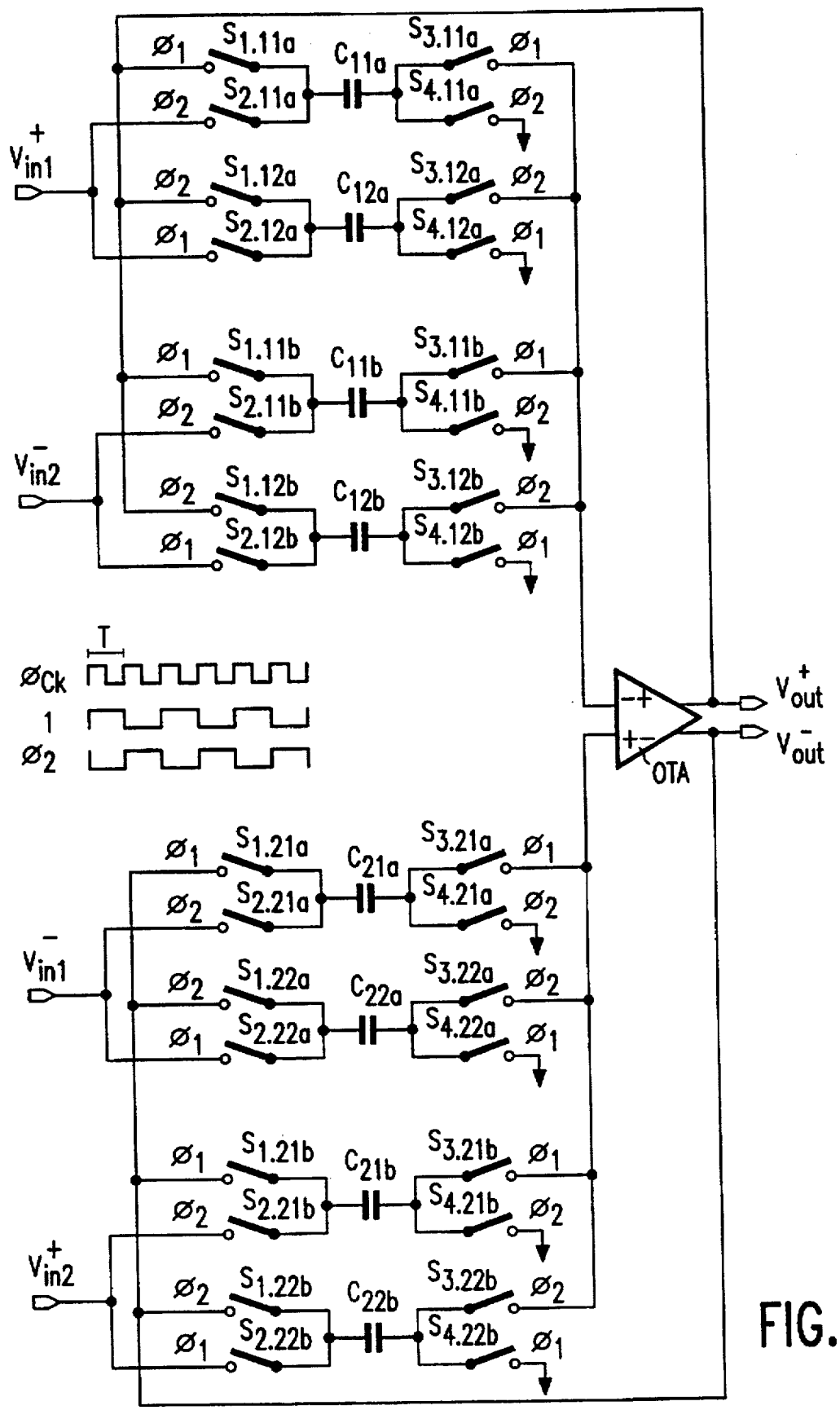
FIG. 4 shows a differential one sampling period delay and subtracting circuit in accordance with a fourth embodiment of the invention.

FIG. 4 shows a subtracting delay section in which two differential signals (Vin1+, Vin1−) and (Vin2+, Vin2−) are subtracted and delayed over a sampling period. The circuit of FIG. 4 is similar to that of FIG. 3, with the sole difference that the inputs Vin2+ and Vin2− are interchanged.

The following formula holds for the circuit of FIG. 4:

$$Vout(nT)=[C1.Vin1((n-1)T)-C2.Vin2((n-1)T)]/(C1+C2),$$

where $$C11a=C12a=C21a=C22a=C1,$$

and $$C11b=C12b=C21b=C22b=C2.$$

Figure 5A:
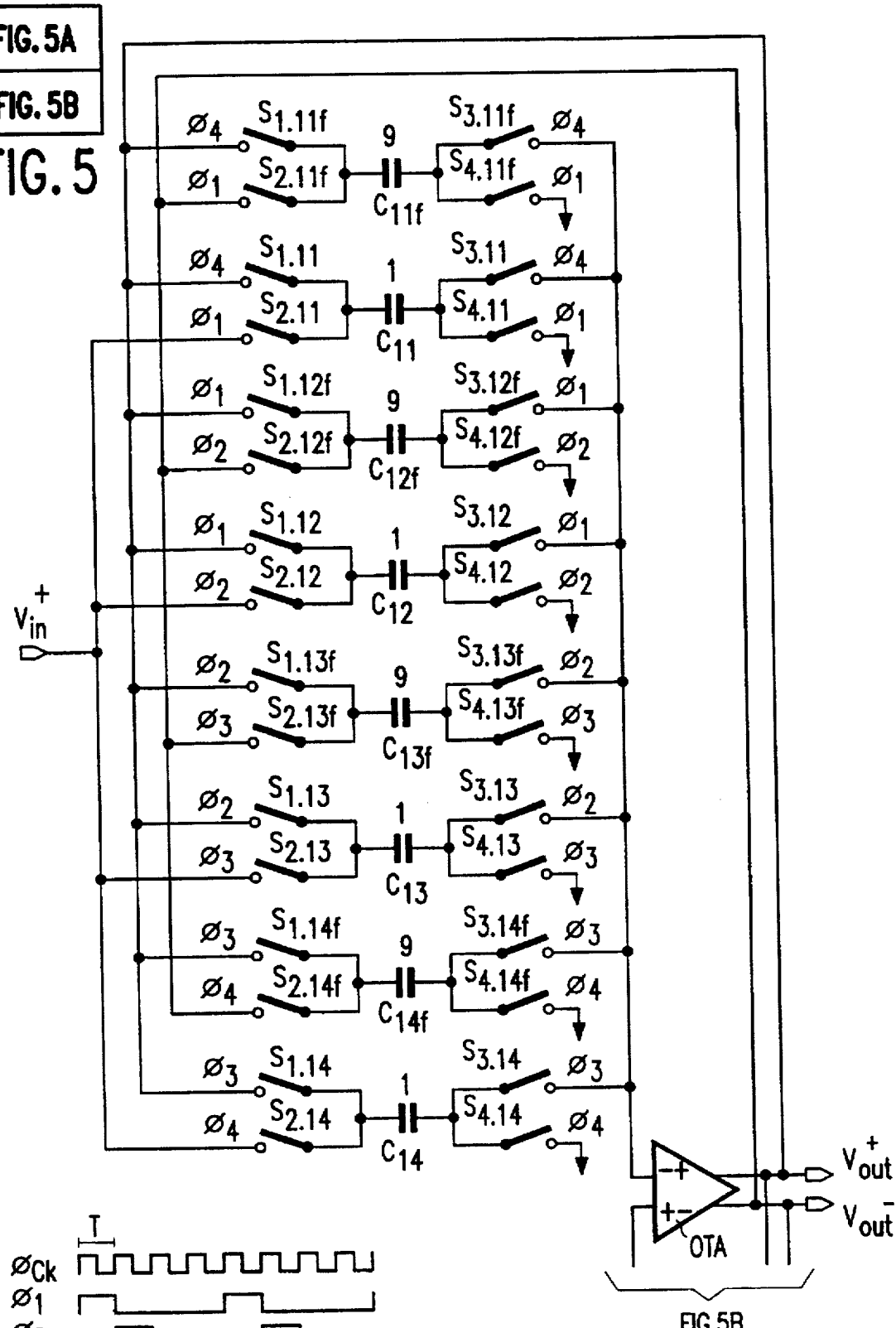
FIGS. 5A and 5B show recursive differential switched capacitor filter circuits in accordance with a fifth embodiment of the invention.
Figure 5A:
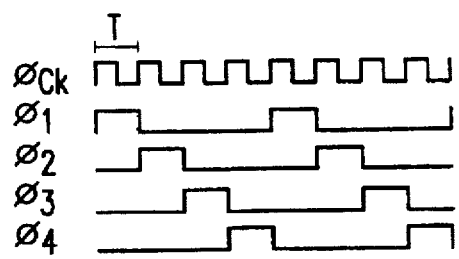
Figure 5B:
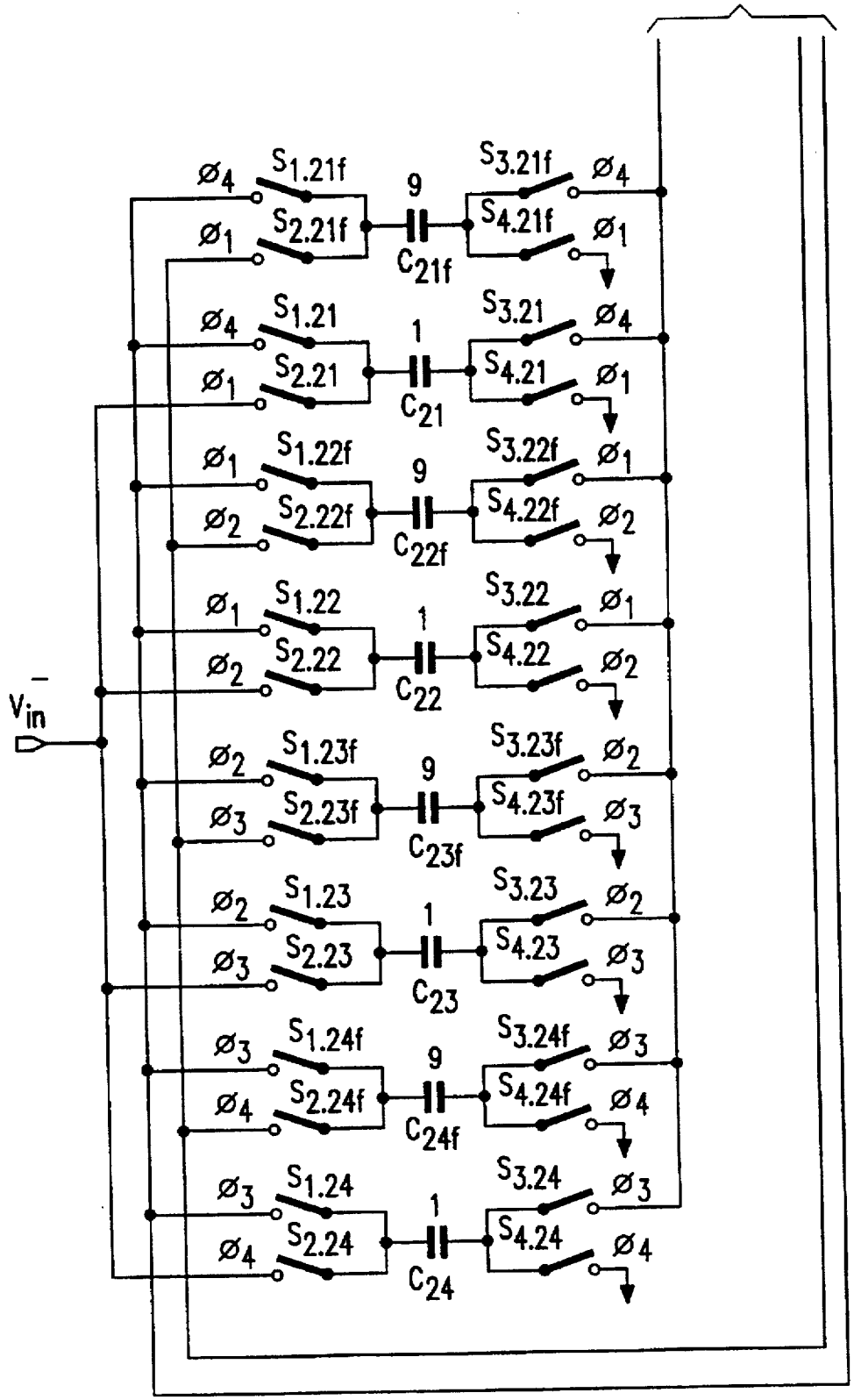

FIG. 5 shows an embodiment of a recursive filter section in accordance with the present invention, more specifically, of a differential charge redistribution switched capacitor SECAM cloche filter. In contrast with the previous FIGS. 1–4, in which each set of switched capacitors comprised 2 capacitors the switches of which were operated at 2 mutually different switching phases within each set, in FIG. 5, each set of switched capacitors comprises 4 capacitors the switches of which are operated at 4 mutually different switching phases within each set. Accordingly, the non-inverting output (+) of the differential amplifier OTA is applied to the capacitors C11, C12, C13 and C14 thru the first switches S1.11, S1.12, S1.13 and S1.14, respectively. The differential input signal Vin+ is applied to the capacitors C11, C12, C13 and C14 thru the second switches S2.11, S2.12, S2.13 and S2.14, respectively. Third switches S3.11, S3.12, S3.13 and S3.14 connect the capacitors C11, C12, C13 and C14, respectively, to the inverting input (−) of the differential amplifier OTA. Fourth switches S4.11, S4.12, S4.13 and S4.14 connect the capacitors C11, C12, C13 and C14, respectively, to ground. Similarly, the inverting output (−) of the differential amplifier OTA is applied to the capacitors C21, C22, C23 and C24 thru the first switches S1.21, S1.22, S1.23 and S1.24, respectively. The differential input signal Vin− is applied to the capacitors C21, C22, C23 and C24 thru the second switches S2.21, S2.22, S2.23 and S2.24, respectively. Third switches S3.21, S3.22, S3.23 and S3.24 connect the capacitors C21, C22, C23 and C24, respectively, to the non-inverting input (+) of the differential amplifier OTA. Fourth switches S4.21, S4.22, S4.23 and S4.24 connect the capacitors C21, C22, C23 and C24, respectively, to ground.

In addition thereto, the recursive filter section of FIG. 5 comprises a similar number of feedback paths. More specifically, in addition to each direct switched capacitor arrangement (capacitor plus corresponding switches) between the non-inverting input Vin+ of the filter and the inverting input (−) of the differential amplifier OTA, a feedback switched capacitor arrangement is present between the inverting output (−) and the inverting input (−) of the differential amplifier OTA. Also, in addition to each direct switched capacitor arrangement between the inverting input Vin of the filter and the non-inverting input (+) of the differential amplifier OTA, a feedback switched capacitor arrangement is present between the non-inverting output (+) and the non-inverting input (+) of the differential amplifier OTA. The switches in these feedback switched capacitor arrangements are operated at the same switching phases as the corresponding switches in the direct switched capacitor arrangements. Accordingly, in FIG. 5, the same references have been used for the direct switched capacitor arrangements and for the feedback switched capacitor arrangements, whereby the feedback elements have been indicated with an additional "f".

In the embodiment of FIG. 5, the capacitance of each of the feedback capacitors is nine times the capacitance of each of the direct capacitances.

The differential switched capacitor filter section according to the invention can even be used for processing (e.g., delaying) a non-differential input signal to provide differential delayed output signals. In such an embodiment, resembling that of FIG. 1, in the first set of switched capacitors C11, C12, the non-differential input signal is applied to the corresponding input Vin+ of the filter circuit (to which the second switches S2.11, S2.12 are connected) and the reference terminal (to which the fourth switches S4.11, S4.12 are connected) is coupled to ground. In the second set of switched capacitors C21, C22, the non-differential input signal is applied to the reference terminal (to which the fourth switches S4.21, S4.22 are connected) and the corresponding input Vin− of the filter circuit (to which the second switches S2.21, S2.22 are connected) is coupled to ground. This circuit is perfectly symmetrical and performs a sample-and-hold and a single-to-differential conversion. The filter section, in accordance with the present invention, can also be used to additively or subtractively combine a differential input signal and a non-differential input signal without requiring any additional stages or additional clock cycles, which is especially advantageous in, for example, an algorithmic A/D converter where the clock cycles per bit is critical. Such a combination of differential and non-differential input signals can be obtained if, in the embodiments of FIGS. 3, 4, the differential input signal is applied to the terminals Vin1+, Vin1−, as described with reference to FIGS. 3, 4, while the non-differential input signal is applied to the terminal Vin2+ and the reference terminals to which the switches S4.21b, S4.22b are connected, while the terminal Vin2− is connected to ground.

In sum, the invention concerns a multi-functional wide bandwidth differential switched capacitor circuit, which is based on a single differential amplifier (OTA) high speed charge redistribution technique. Delay, multiplication, summation and subtraction of multiple signals is possible, such as required in N-path filters and sampled data multipliers. For example, the summer and subtracter circuits of FIGS. 3, 4 may be used in an N-path realization to create symmetrical and anti-symmetrical FIR filters, as well as IIR filters. In terms of high speed, accuracy, and noise immunity, the proposed solution appeared to be very advantageous. The circuit enables the use of parasitic wiring capacitances for video frequencies which otherwise would not be possible at reasonable power levels. The invention maintains the prior art advantages since there is no charge transfer via a virtual earth point between the capacitors, and since the capacitor nodes are switched either between ground and virtual ground, or between voltage sources, so that the circuit is insensitive to parasitic capacitances. However, the prior art disadvantages are reduced due to the provision of a second set of switched capacitors in the manner defined by the present invention.

It should be noted that the above-mentioned embodiments illustrate rather than limit the invention, and that those skilled in the art will be able to design many alternative embodiments without departing from the scope of the appended claims. While sets of 2 and 4 capacitors respectively switched in 2 and 4 mutually different phases are shown, other numbers are also possible.

I claim:

1. A differential switched capacitor filter section having at least one pair of differential inputs and at least one pair of differential outputs, the filter section comprising:

a differential amplifier;

a first set of switched capacitors coupled between a non-inverting output and an inverting input of said differential amplifier;

a second set of switched capacitors coupled between an inverting output and a non-inverting input of said differential amplifier, wherein said inverting and non-inverting outputs of said differential amplifier are coupled to said at least one pair of differential outputs of said filter section; and wherein, in said sets of switched capacitors, first terminals of the switched capacitors are coupled to a corresponding one of said outputs of said differential amplifier thru first switches operating at mutually differing switching phases within each set, and to one of said differential inputs of said filter section thru second switches operating at mutually differing switching phases within each set, while second terminals of the capacitors are coupled to a corresponding one of said inputs of said differential amplifier thru third switches operating at mutually differing switching phases within each set, and to a reference terminal thru fourth switches operating at mutually differing switching phases within each set.

2. A differential switched capacitor filter section as defined in claim 1, for combining at least two differential input signal pairs, wherein the filter section comprises at least two pairs of differential inputs coupled to respectively receive said at least two differential input signal pairs, each one of said differential inputs being coupled to a respective set of switched capacitors, and wherein the first terminals of the switched capacitors in each one of said sets of switched capacitors are coupled to one of said differential inputs of the filter section and to one of said outputs of said differential amplifier, and wherein the second terminals of the switching capacitors in each one of said sets of switched capacitors are coupled to one of said inputs of said differential amplifier.

3. A differential switched capacitor filter section as defined in claim 1, for recursively filtering signals applied to said at least one pair of differential inputs of said filter section, wherein the filter section further comprises:

a first feedback set of switched capacitors coupled between an inverting output and a non-inverting input of said differential amplifier;

a second feedback set of switched capacitors coupled between a non-inverting output and an inverting input of said differential amplifier;

in said feedback sets of switched capacitors, first terminals of the switched capacitors are coupled to one of said outputs of said differential amplifier thru first switches operating at mutually differing switching phases within each set, and to the other of said outputs of said differential amplifier thru second switches operating at mutually differing switching phases within each set, while second terminals of the capacitors are coupled to a corresponding one of said inputs of said differential amplifier thru third switches operating at mutually differing switching phases within each set, and to a reference terminal thru fourth switches operating at mutually differing switching phases within each set.

4. A differential switched capacitor filter section as defined in claim 1, for processing a non-differential input signal, wherein, in said first set of switched capacitors, the non-differential input signal is applied to the corresponding input of the filter circuit and the reference terminal is coupled to ground, while in said second set of switched capacitors, the non-differential input signal is applied to the reference terminal and the corresponding input of the filter circuit is coupled to ground.

* * * * *